(12) United States Patent
Jensen et al.

(10) Patent No.: US 9,430,443 B1
(45) Date of Patent: Aug. 30, 2016

(54) SYSTEMATIC CODING TECHNIQUE

(71) Applicant: Norwegian University of Science and Technology, Trondheim (NO)

(72) Inventors: Rune Erlend Jensen, Trondheim (NO); Katina Kralevska, Trondheim (NO); Danilo Gligoroski, Trondheim (NO); Sindre Berg Stene, Trondheim (NO)

(73) Assignee: Norwegian University of Science and Technology, Trondheim (NO)

( * ) Notice: Subject to any disclaimer, the term of this patent is extended or adjusted under 35 U.S.C. 154(b) by 0 days.

(21) Appl. No.: 14/707,211

(22) Filed: May 8, 2015

(51) Int. Cl.
*G06F 17/16* (2006.01)
*H03M 13/11* (2006.01)

(52) U.S. Cl.
CPC .......... *G06F 17/16* (2013.01); *H03M 13/1174* (2013.01)

(58) Field of Classification Search
CPC ................... H03M 13/6516; H03M 13/1148; H03M 13/1174
See application file for complete search history.

(56) References Cited

U.S. PATENT DOCUMENTS

| 4,477,903 A | * | 10/1984 | Schouhamer Immink et al. ............................. 714/755 |
| 7,278,085 B1 | * | 10/2007 | Weng et al. .................. 714/766 |

(Continued)

FOREIGN PATENT DOCUMENTS

WO    WO 2009/129054 A2    10/2009

OTHER PUBLICATIONS

Combined Search and Examination Report issued in corresponding EPO Application No. GB1507934.6, dated Jun. 9, 2015 wherein references US 2013/0173996 A1 and WO 2009/129054 A3.

(Continued)

*Primary Examiner* — M. Mujtaba K Chaudry

(74) *Attorney, Agent, or Firm* — Saliwanchik, Lloyd & Eisenschenk

(57) ABSTRACT

Disclosed herein is a method of generating a generator matrix for defining how to systematically code source data, the method comprising: determining source nodes for comprising a plurality of sub-stripes of source data, wherein the number of source nodes is K and the number of sub-stripes of source data comprised by each source node is S; determining redundant nodes for comprising a plurality of sub-stripes of coded data, wherein the number of redundant nodes is R and the number of sub-stripes of coded data comprised by each redundant node is S; determining values of a first generator matrix according to a systematic coding technique such that K of the rows of the generator matrix to define how to generate all of the K source nodes as comprising source data and R of the rows of the first generator matrix define how to generate all of the R redundant nodes as comprising combinations of two or more of the source nodes; generating a second generator matrix, with a first dimension (K×S) and a second dimension ((K+R)×S), in dependence on the determined first generator matrix, wherein each value of the second generator matrix defines how to generate the data comprised by a respective sub-stripe of a node defined by the first generator matrix such that the values of the second generator matrix define how to generate all of the sub-stripes of all of the nodes defined by the first generator matrix; and changing one or more of the values of the second generator matrix so that a sub-stripe of at least one of the redundant nodes is defined, by the systematic coding technique, as being dependent on a combination of two or more sub-stripes of data in the source nodes and is further defined as being dependent on one or more further sub-stripes of data, in a respective one or more source nodes, that the sub-stripe of the redundant node was not defined as being dependent on by the systematic coding technique. Advantageously, when the second generator matrix is used to generate erasure coded data in a data storage system, the amount of data that needs to be obtained to reconstruct a lost data node is less than if Reed-Solomon or other known coding techniques had been used.

12 Claims, 11 Drawing Sheets

(56) References Cited

U.S. PATENT DOCUMENTS

| | | | |
|---|---|---|---|
| 8,533,572 B2* | 9/2013 | Lu et al. | 714/773 |
| 2003/0225743 A1* | 12/2003 | Inokuchi | 707/3 |
| 2011/0172975 A1* | 7/2011 | Silva Filho et al. | 703/2 |
| 2012/0079342 A1* | 3/2012 | Lu et al. | 714/755 |
| 2013/0173996 A1 | 7/2013 | Anderson et al. | |
| 2014/0039175 A1* | 2/2014 | Silva Filho et al. | 536/23.1 |

OTHER PUBLICATIONS

K.V. Rashmi et al., "Optimal Exact-Regenerating Codes for Distributed Storage at the MSR and MBR Points via a Product-Matrix Construction", in Information Theory, IEEE Transactions on, vol. 57, No. 8, Aug. 2011, pp. 5227-5239.

D.S. Papailiopoulos, et al., "Repair Optimal Erasure Codes Through Hadamard Designs", in Information Theory, IEEE Transactions on, vol. 59, No. 5, May 2013, pp. 3021-3037.

D.S. Papailiopoulos, et al., "Simple regenerating codes: Network coding for cloud storage", in INFOCOM, 2012 Proceedings IEEE, Mar. 2012, pp. 2801-2805.

A.G. Dimakis et al., "Network coding for distributed storage systems", IEEE Transactions on Information Theory, Sep. 2010, pp. 4539-4551.

O. Khan et al., "Rethinking erasure codes for cloud file systems: minimizing I/O for recovery and degraded reads", USENIX conference on File and Storage Technologies, FAST 2012.

K.V. Rashmi et al., "A hitchhiker's guide to fast and efficient data reconstruction in erasure-coded data centers", ACM SIGCOMM 2014.

Yunnan Wu, "A Construction of Systematic MDS Codes with Minimum Repair Bandwidth", in Information Theory, IEEE Transactions on, vol. 57, No. 6, Jun. 2011, pp. 3738-3741.

K.V. Rashmi et al., "Having Your Cake and Eating It Too: Jointly Optimal Erasure Codes for I/O, Storage, and Network-bandwidth", USENIX Conference on File and Storage Technologies, FAST 15.

K.V. Rashmi et al., "A Piggybacking Design Framework for Read-and Download-efficient Distributed Storage Codes," IEEE International Symposium on Information Theory 2013.

I. Tamo et al., "Zigzag codes: Mds array codes with optimal rebuilding", IEEE Transactions on Information Theory, Mar. 2013, pp. 1597-1616.

I. Tamo et al., "Access vs. bandwidth in codes for storage", IEEE Transactions on Information Theory 2013.

N.B. Shah et al., "Interference alignment in regenerating codes for distributed storage: Necessity and code constructions", IEEE Transactions on Information Theory, 2012, pp. 2134-2158.

A.M. Kermarrec et al., "Repairing Multiple Failures with Coordinated and Adaptive Regenerating Codes", in Network Coding (NetCod), 2011 International Symposium on, Jul. 2011, pp. 1-6 and 25-27.

C. Huang et al., "Erasure coding in windows azure storage", In USENIX Annual Technical Conference, 2012, pp. 15-26.

V.R. Cadambe et al., "Polynomial length mds codes with optimal repair in distributed storage", Asilomar Conference on Signals, Systems and Computers, Nov. 2011, pp. 1850-1854.

N.B. Shah, "On Minimizing Data-Read and Download for Storage-Node Recovery", IEEE Communications Letters, 2013, pp. 964-967.

E. Pinheiro et al., "Failure Trends in a Large Disk Drive Population", USENIX Conference on File and Storage Technologies, FAST 2007.

Sian-Jheng Lin et al., "A Unified Form of Exact-MSR Codes via Product-Matrix Frameworks", in Information Theory, IEEE Transactions on, vol. 61, No. 2, Feb. 2015, pp. 873-886.

D. Ford et al., "Availability in globally distributed storage systems", OSDI'10, 2010, pp. 1-7.

M. Sathiamoorthy et al., XORing Elephants: Novel Erasure Codes for Big Data, Proceedings of the VLDB Endowment, 2013.

Z. Wang et al., Rebuilding for Array Codes in Distributed Storage Systems, IEEE GLOBECOM Workshops, 2010.

Y. Hu et al., NCCloud: Applying Network Coding for the Storage Repair in a Cloud-of-Clouds, FAST 2012.

\* cited by examiner

|   |       | Source Data |   |   |   |   |   |   |   |   |   |   |   |
|---|-------|---|---|---|---|---|---|---|---|---|---|---|---|
| D1 | D1.1 | 1 |   |   |   |   |   |   |   |   |   |   |   |
|    | D1.2 |   | 1 |   |   |   |   |   |   |   |   |   |   |
|    | D1.3 |   |   | 1 |   |   |   |   |   |   |   |   |   |
| D2 | D2.1 |   |   |   | 1 |   |   |   |   |   |   |   |   |
|    | D2.2 |   |   |   |   | 1 |   |   |   |   |   |   |   |
|    | D2.3 |   |   |   |   |   | 1 |   |   |   |   |   |   |
| D3 | D3.1 |   |   |   |   |   |   | 1 |   |   |   |   |   |
|    | D3.2 |   |   |   |   |   |   |   | 1 |   |   |   |   |
|    | D3.3 |   |   |   |   |   |   |   |   | 1 |   |   |   |
| D4 | D4.1 |   |   |   |   |   |   |   |   |   | 1 |   |   |
|    | D4.2 |   |   |   |   |   |   |   |   |   |   | 1 |   |
|    | D4.3 |   |   |   |   |   |   |   |   |   |   |   | 1 |
| R1 | R1.1 | 1 | 1 | 1 |   |   |   |   |   |   |   |   |   |
|    | R1.2 |   |   |   | 1 | 1 | 1 |   |   |   |   |   |   |
|    | R1.3 |   |   |   |   |   |   | 1 | 1 | 1 |   |   |   |
| R2 | R2.1 | 2 | 2 | 2 | 2 |   |   |   |   |   |   |   |   |
|    | R2.2 |   |   |   |   | 2 | 2 | 2 | 2 |   |   |   |   |
|    | R2.3 |   |   |   |   |   |   |   |   | 2 | 2 | 2 | 2 |
| R3 | R3.1 | 3 | 3 | 3 | 3 |   |   |   |   |   |   |   |   |
|    | R3.2 |   |   |   |   | 3 | 3 | 3 | 3 |   |   |   |   |
|    | R3.3 |   |   |   |   |   |   |   |   | 3 | 3 | 3 | 3 |

*FIG. 1*

| Data dr. 1 | Data dr. 2 | Data dr. 3 | Data dr. 4 | Data dr. 5 | Data dr. 6 | Data dr. 7 | Data dr. 8 | Data dr. 9 | Data dr. 10 | |
|---|---|---|---|---|---|---|---|---|---|---|
| A1 | A2 | A3 | A4 | A5 | A6 | A7 | A8 | A9 | A10 | SSRG 1_1 |
| B1 | B2 | B3 | B4 | B5 | B6 | B7 | B8 | B9 | B10 | SSRG 1_2 |
| C1 | C2 | C3 | C4 | C5 | C6 | C7 | C8 | C9 | C10 | SSRG 1_3 |
| D1 | D2 | D3 | D4 | D5 | D6 | D7 | D8 | D9 | D10 | SSRG 1_4 |
| A1 | A2 | A3 | A4 | A5 | A6 | A7 | A8 | A9 | A10 | SSRG 2_1 |
| B1 | B2 | B3 | B4 | B5 | B6 | B7 | B8 | B9 | B10 | SSRG 2_2 |
| C1 | C2 | C3 | C4 | C5 | C6 | C7 | C8 | C9 | C10 | SSRG 2_3 |
| D1 | D2 | D3 | D4 | D5 | D6 | D7 | D8 | D9 | D10 | SSRG 2_4 |
| A1 | A2 | A3 | A4 | A5 | A6 | A7 | A8 | A9 | A10 | SSRG 3_1 |
| B1 | B2 | B3 | B4 | B5 | B6 | B7 | B8 | B9 | B10 | SSRG 3_2 |
| C1 | C2 | C3 | C4 | C5 | C6 | C7 | C8 | C9 | C10 | SSRG 3_3 |
| D1 | D2 | D3 | D4 | D5 | D6 | D7 | D8 | D9 | D10 | SSRG 3_4 |
| A1 | A2 | A3 | A4 | A5 | A6 | A7 | A8 | A9 | A10 | SSRG 4_1 |
| B1 | B2 | B3 | B4 | B5 | B6 | B7 | B8 | B9 | B10 | SSRG 4_2 |
| C1 | C2 | C3 | C4 | C5 | C6 | C7 | C8 | C9 | C10 | SSRG 4_3 |
| D1 | D2 | D3 | D4 | D5 | D6 | D7 | D8 | D9 | D10 | SSRG 4_4 |

Example for (K+R, K) = (14, 10)

| | $a_1$ | $b_1$ | $c_1$ | $d_1$ |
|---|---|---|---|---|
| Source data | ⋮ | ⋮ | ⋮ | ⋮ |
| | $a_{10}$ | $b_{10}$ | $c_{10}$ | $d_{10}$ |
| Parity data | $f_1(a)$ | $f_1(b)$ | $f_1(c)$ | $f_1(d)$ |
| | $f_2(a)+b_1+b_2+b_3$ | $f_2(b)+a_4+a_5+a_6$ | $f_2(c)+a_7+a_8$ | $f_2(d)+a_9+a_{10}$ |
| | $f_3(a)+c_1+c_2+c_3$ | $f_3(b)+c_4+c_5+c_6$ | $f_3(c)+b_7+b_8$ | $f_3(d)+b_9+b_{10}$ |
| | $f_4(a)+d_1+d_2+d_3$ | $f_4(b)+d_4+d_5+d_6$ | $f_4(c)+d_7+d_8$ | $f_4(d)+c_9+c_{10}$ |

1st sub-stripe    2nd sub-stripe    3rd sub-stripe    4th sub-stripe

Stripe

| | Data dr. 1 | Data dr. 2 | Data dr. 3 | Data dr. 4 | Data dr. 5 | Data dr. 6 | Data dr. 7 | Data dr. 8 | Data dr. 9 | Data dr. 10 |
|---|---|---|---|---|---|---|---|---|---|---|
| F_1_A (Unmodified) | A1 | A2 | A3 | A4 | A5 | A6 | A7 | A8 | A9 | A10 |
| F_1_B (Unmodified) | B1 | B2 | B3 | B4 | B5 | B6 | B7 | B8 | B9 | B10 |
| F_2_A (Unmodified) | A1 | A2 | A3 | A4 | A5 | A6 | A7 | A8 | A9 | A10 |
| F_2_B (3 extra) | A1 B1 | A2 B2 | A3 B3 | B4 | B5 | B6 | B7 | B8 | B9 | B10 |
| F_3_A (Unmodified) | A1 | A2 | A3 | A4 | A5 | A6 | A7 | A8 | A9 | A10 |
| F_3_B (3 extra) | B1 | B2 | B3 | A4 B4 | A5 B5 | A6 B6 | B7 | B8 | B9 | B10 |
| F_4_A (Unmodified) | A1 | A2 | A3 | A4 | A5 | A6 | A7 | A8 | A9 | A10 |
| F_4_B (4 extra) | B1 | B2 | B3 | B4 | B5 | B6 | A7 B7 | A8 B8 | A9 B9 | A10 B10 |

*FIG. 7*

SYSTEMATIC CODING TECHNIQUE

FIELD

The field of the invention is the systematic coding of data. A particularly advantageous application for coded data according to embodiments is in a data storage system. The number of read operations required to reconstruct unavailable data is reduced from that of known coding techniques with comparable storage requirements.

BACKGROUND

Data centres that provide an easily accessible store of data are a necessary resource for many entities. The amount of data stored in a data centre may be in the order of multiple petabytes. It is normal for a data centre to be built from a plurality of separate data storage units to provide a data centre with expandable capacity and so that different parts of the data storage centre can be maintained independently. All, or part of, each of these data storage units may occasionally be offline due to a failure occurring or the data storage unit deliberately being taken offline for maintenance. The data is therefore preferably stored in such a way that it is still accessible when any of the data storage units for storing the data are offline. A known technique is to store the data in a replicated manner. That is to say, the same data stored in a data storage unit is also stored in one or more other, separate, data storage units. This approach allows fast retrieval of data from a back-up data storage unit if one of the primary data storage units is offline.

A problem with storing data in a replicated manner is that the demand on data storage capacity is greatly increased and this increases costs. To solve this problem, it is known to use erasure codes for data storage. Using erasure codes for data storage requires additional processing to reconstruct unavailable data. However, the data storage requirements are a lot lower than those of replication systems. Reed-Solomon codes are well known error correcting codes that can be used as erasure codes for data storage. For a systematic implementation of a Reed-Solomon code as an erasure code, data is coded into a plurality of source data nodes, k, and a plurality of redundant data nodes, r, the total number of data nodes, n, being k+r. The source and redundant data nodes may be stored in a plurality of different data storage units, the data storage units each storing one or more data nodes. Due to the reconstruction properties of Reed-Solomon codes, if any r of the n data nodes are unavailable due to their data storage unit being offline, then the r data nodes can still be obtained through processing performed on a plurality of the other data nodes.

A number of other coding techniques than Reed-Solomon are suitable for such data reconstructions. If the coding technique has the capability that any k nodes are able to reconstruct all of the source data nodes, the coding technique is Maximum Distance Separable, MDS. If the number of data nodes that are required to reconstruct a node is d, then for standard Reed-Solomon d=k.

It is highly preferable for the stored data to be coded systematically. This allows stored source data to be read directly from a data storage unit, without any processing being required to reconstruct the source data, if the data storage unit storing the source data is online.

There are known problems with using coded data for data storage as described above. For each data node that needs to be reconstructed, it is necessary to perform k read operations to obtain other data nodes and then processing operations to reconstruct the data nodes. The large number of read operations causes the data node reconstruction process to be slow and also results in a large increase in data traffic within the storage system.

An attempt to reduce the above-described problems of erasure codes is disclosed in the paper 'A "Hitchhiker's" Guide to Fast and Efficient Data Reconstruction in Erasure-coded Data Centres' by K. V. Rashimi et al, SIGCOMM 2014, Computer Communication Review, August 2014. In this paper a coding technique is disclosed that is motivated by a 'piggy backing' technique. The redundant data packets of two separate systematically coded sets of data packets are effectively combined with each other in a manner that reduces the necessary number of data reads. A first set of systematically coded data packets is generated using Reed-Solomon. A second set of systematically coded data packets is separately generated using Reed-Solomon. Each of the source data packets in the first set of data packets is respectively associated with source data packets in the second set of coded data packets and each of the redundant data packets in the first set of data packets is respectively associated with a redundant data packet in the second set of coded data packets. Each pair of associated data packets of the sets of coded data packets is stored together in the same data storage unit. The pairs of associated data packets are each stored in different data storage units. Accordingly, each data storage unit stores a pair of data packets, one from each set of coded data packets. The data packet form the first set of coded data packets is stored in a first sub-stripe of the data storage unit and the data packet form the second set of coded data packets is stored in a second sub-stripe of the same data storage unit, the first and second sub-stripes preferably not being contiguous. The paper provides results that demonstrate that the techniques for generating redundant data packets disclosed therein reduce the number of data read operations required from if the data had been coded using Reed-Solomon.

Other techniques for coding data for storage in a data centre exist that all aim to reduce the amount of read data from what is necessary with standard Reed-Solomon coding. The coding techniques differ in how effective they are at improving on Reed-Solomon coding, the properties of the code that can be used (including the relative number of source and redundant data packets), the amount of processing required to generate the coded data and the amount of processing required to reconstruct source data from the coded data. For example, some coding techniques reduce the amount of data that needs to be read from that of Reed-Solomon but incur the drawback of it being necessary to store more data than if Reed-Solomon coding had been used. Other coding techniques do not allow the use of systematic codes and therefore incur the drawback of increasing the processing requirements.

There remains a need to improve on all known MDS coding techniques that have the advantageous properties of being systematic and not requiring a higher data storage capacity as standard Reed-Solomon.

SUMMARY

According to a first aspect of the invention, there is provided a method of generating a generator matrix for defining how to systematically code source data, the method comprising: determining source nodes for comprising a plurality of sub-stripes of source data, wherein the number of source nodes is K and the number of sub-stripes of source data comprised by each source node is S: determining redundant nodes for comprising a plurality of sub-stripes of coded data, wherein the number of redundant nodes is R and the number of sub-stripes of coded data comprised by each redundant node is S; determining values of a first generator matrix according to a systematic coding technique such that K of the rows of the generator matrix to define how to generate all of the K source nodes as comprising source data and R of the rows of the first generator matrix define how to generate all of the R redundant nodes as comprising combinations of two or more of the source nodes; generating a 20 second generator matrix, with a first dimension (K×S) and a second dimension ((K+R)×S), in dependence on the determined first generator matrix, wherein each value of the second generator matrix defines how to generate the data comprised by a respective sub-stripe of a node defined by the first generator matrix such that the values of the second generator matrix define how to generate all of the sub-stripes of all of the nodes defined by the first generator matrix; and changing one or more of the values of the second generator matrix so that a sub-stripe of at least one of the redundant nodes is defined, by the systematic coding technique, as being dependent on a combination of two or more sub-stripes of data in the source nodes and is further defined as being dependent on one or more further sub-stripes of data, in a respective one or more source nodes, that the sub-stripe of the redundant node was not defined as being dependent on by the systematic coding technique.

Preferably, S is greater than or equal to R.

Preferably, the method further comprises: determining not to change the values in the second generator matrix that define, in accordance with the systematic coding technique, the sub-stripes of the source nodes used to generate the sub-stripes of one of the redundant nodes; wherein said one of the redundant nodes is defined by the first generator matrix as a combination of all of the source nodes.

Preferably, determining the values in the second generator matrix that are changed comprises: determining to group the sub-stripes of the defined redundant nodes by the second generator matrix into groups, SSRGs, such that each sub-stripe of each redundant node is a member of an SSRG, each sub-stripe within a redundant node is a member of a different SSRG and the number of SSRGs is S; determining to group the defined source nodes by the second generator matrix into node groups, DSGs, wherein each source node is associated with a DSG and the number of DSGs is S; associating each DSG with one of the SSRGs; determining to change the values of a sub-stripe in the second generator matrix in dependence on the DSG associated with the SSRG that the sub-stripe is a member of.

Preferably, the number of nodes in each DSG is K/R, when K/R is an integer; and the number of nodes in each DSG is either ceiling(K/R) or (ceiling(K/R)−1), when K/R is not an integer.

Preferably, each SSRG comprises only one sub-stripe from each of all of the redundant nodes.

Preferably, the changed values in the second generator matrix are determined for the $i^{th}$ sub-stripe of the $k^{th}$ redundant node in dependence on the equation:

$SSRG_{k,i}\mathrel{+}=data_{j,l}$ for $k \in [2, 3, \ldots, R]$, $i \in [1, 2, \ldots, S]$, $j \in DSGi$, $$l = \begin{cases} k, & \text{if } i < k \\ k-1, & \text{otherwise} \end{cases}$$

where $data_{j,l}$ is the $l^{th}$ sub-stripe in the $j^{th}$ source node.

Preferably, the method further comprises: determining if the second generator matrix defines an MDS code: and, if the second generator matrix does not define an MDS code, repeatedly changing one or more values of the second generator matrix and determining if the second generator matrix defines an MDS code until the second generator matrix defines an MDS code. Preferably, determining if the second generator matrix defines an MDS code comprises: generating S codes, wherein each code has a first the dimension comprising one element and a second dimension comprising ((K+R)×S) elements, and the S codes concatenate to form all of the elements of the second generator matrix; and determining that the second generator matrix defines an MDS code if all of the S codes are linearly independent to each other.

Preferably, R is less than or equal to K.

Preferably, R is less than or equal to K/4.

Preferably, the coding technique used to generate the first generator matrix is a coding technique for generating an MDS code.

Preferably, R is 3 or more.

Preferably, the source and redundant nodes defined by the second generator matrix are storage nodes in a data storage system.

According to a second aspect of the invention there is provided a coding technique for generating coded data from source data, the coding technique being equivalent to generating the coded data in dependence on the second generator matrix generated according to the first aspect of the invention.

According to a third aspect of the invention, there is provided a method of recovering an offline node that is one of a plurality of systematically coded source and redundant nodes, the method comprising: performing a first set of reading operations to obtain a plurality of sub-stripes of source nodes and a sub-stripe of a redundant node: recovering a first sub-stripe of the offline node in dependence on the sub-stripes obtained by the first set of reading operations; performing one or more further sets of reading operations to obtain one or more further sub-stripes of one or more of the redundant nodes and one or more further sub-stripes of the source nodes; and recovering one or more of the further sub-stripes of the offline node in dependence on the one or more of the sub-stripes of nodes read in the first set of reading operations and one or more sub-stripes of nodes read in the one or more further sets of reading operations; wherein the number of source nodes is K; the number of redundant nodes is R; the number of sub-stripes of each of the nodes is greater than or equal to R; R is greater than or equal to 3; the total number of sub-stripes read in the first reading operation is K; and the total number of sub-stripes read in each of the further reading operations is less than or equal to K/R or the ceiling of K/R.

Preferably the method, further comprises: obtaining a decoding matrix that is the inverse of the second generator matrix generated according to the first aspect of the invention; and determining the sub-stripes that are obtained in the one or more further sets of reading operations in dependence on the obtained decoding matrix.

Preferably, one or more of the sets of reading operations comprises a single reading operation of a plurality of sub-stripes.

Preferably, the nodes are nodes of a data storage system.

According to a fourth aspect of the invention, there is provided a decoding technique for decoding coded data, the decoding technique being equivalent to decoding coded data in dependence on the inverse of the second generator matrix generated according to the first aspect of the invention.

LIST OF FIGURES

Embodiments of the present invention will now be described in detail, by way of example only, with reference to the accompanying drawings, in which:

FIG. 1 is an example of generator matrix according to an embodiment of the invention;

FIG. 3 shows a generator matrix in a description of an embodiment of the invention;

FIG. 4 is an example of generator matrix according to an embodiment of the invention;

FIG. 5 is an example of generator matrix according to an embodiment of the invention;

FIG. 6 is an example of generator matrix according to an embodiment of the invention;

FIG. 7 is a generator matrix according to a background example;

DESCRIPTION OF EMBODIMENTS

Figure 2:
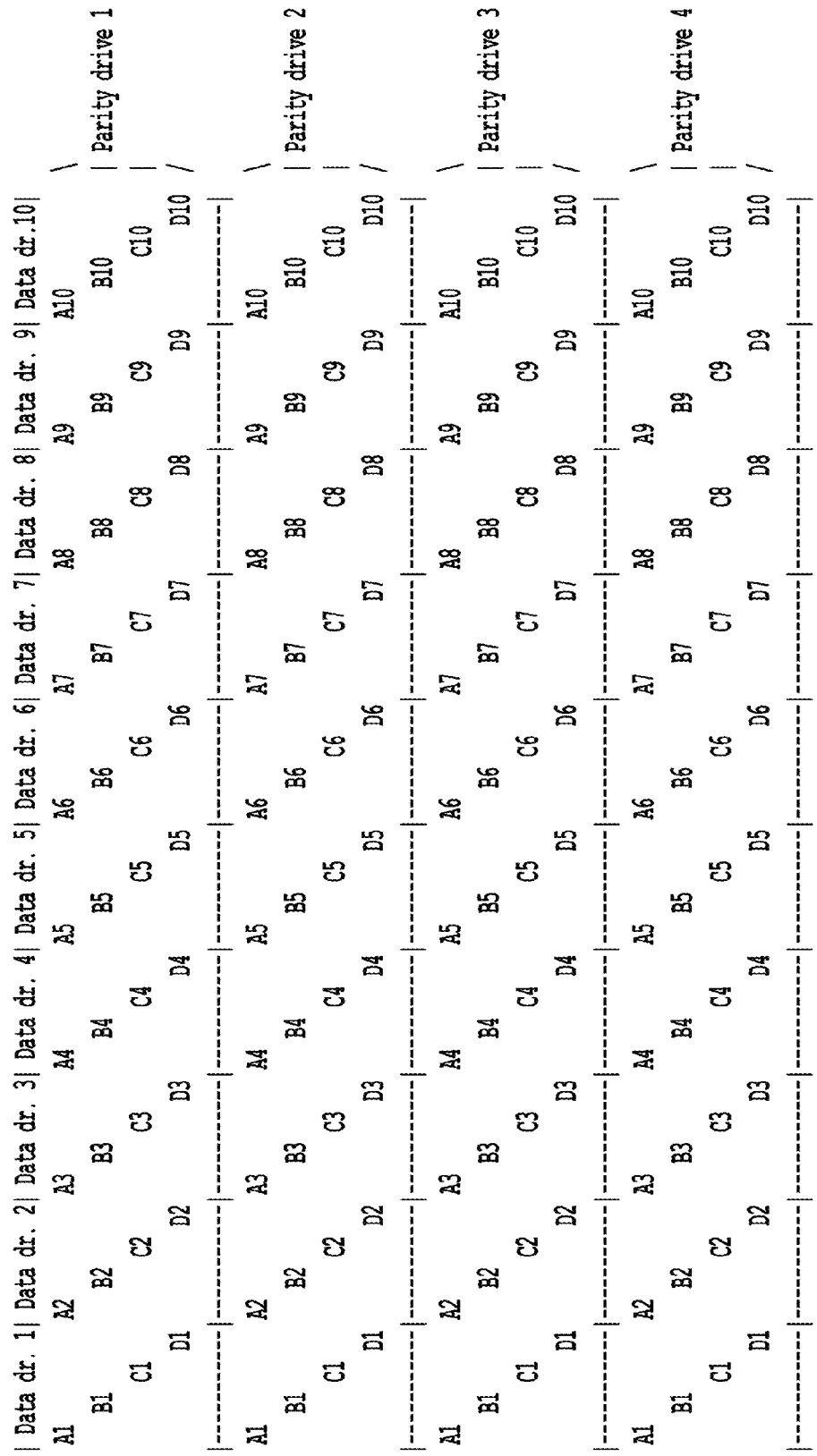
FIG. 2 shows a generator matrix in a description of an embodiment of the invention.

Embodiments of the present invention provide an alternative approach to generating a systematic coded set of data nodes from all known approaches. Embodiments are particularly advantageous for generating coded data for redundant data storage in a data storage system of a data centre. The amount of data that needs to be read in order to obtain data for reconstructing source data is significantly reduced from that required by Reed-Solomon, RS, and other known coding techniques subject to comparable restraints as embodiments. Advantages can include improving the speed of recovery, reducing the network traffic and reducing the storage node and/or disk read amount.

Embodiments use a linear coding. A property of linear codes is that all of their operations including encoding, decoding and reconstruction are performed as linear operations over a finite field. How source data is processed to generate the coded data can be represented by a matrix, known as the generator matrix of the code. The coded data packets are generated as the product of the generator matrix and a vector comprising source data to be encoded.

It should be noted that a generator matrix is a convenient way of representing what, and how, data is combined in order to generate coded data. Other ways of representing how coded data is generated exist, such as polynomial functions. See, for example, 'Introduction to Reed-Solomon Codes'; Expository Paper; Harvard University, Department of Mathematics; Yo Sup and Nathan Kaplan; Aug. 8, 2011.

A systematic code is a code in which the coded data comprises source data, that has not been modified by the coding technique, as well a coded data. A systematic code is preferred for some applications, including data storage, because there may be no need to decode coded data in order the obtain source data. Systematic codes are characterised by their generator matrix comprising the identity matrix.

A systematic generator matrix is defined with the number of columns being the number source data nodes, or packets, and the number of rows being the total number of nodes, or packets. Each column of data corresponds to data within different parts of the string of source data that is being encoded. Generator matrices are well understood and a skilled person would understand how the values, and positions of values, within a generator matrix define how source data is combined and operated on to generate coded data. In particular, the definition of redundant data nodes/packets as a function of source data nodes/packets in operations performed over finite fields is well known.

According to embodiments, a generator matrix for generating a set of coded data packets modifies the coding of data packets at the sub-stripe, or sub-packet, level. Data packets of source data comprise a plurality of sub-packets. For example, a data packet comprising the data bytes {1, 2, 3} comprises three sub-packets that each comprise one byte of data, namely the sub-packets {1}, {2} and {3}.

A generator matrix according to an embodiment is shown in FIG. 1. The source data packets are D1, D2, D3 and D4. The redundant data packets are R1, R2 and R3. The shown generator matrix in FIG. 1 defines the components of three sub-packets of each data packet. A generator matrix that defined operations at the data packet level would have, for each of the source data packets, a single value of '1' where the generator matrix in FIG. 1 has the same single value of '1' in three rows and three columns.

According to embodiments, additional values are selectively introduced into the generator matrix for defining the sub-packets used to generate each redundant data packet. For example, row R2.1 of the generator matrix shown in FIG. 1, i.e. the first sub-packet of the second redundant data packet, and R3.1, i.e. the first sub-packet of the third redundant data packet, are further generated in dependence on a combination with additional sub-packets of the source data.

According to the generator matrix in FIG. 1:

$$R2.1=D1.1^2+D2.1^2+D3.1^2+D4.1^2+D1.2+D2.2$$

$$R3.1=D1.1^3+D2.1^3+D3.1^3+D4.1^3+D1.3+D2.3$$

The above shown powers are purely illustrative of a mathematical operation that is defined by the value in the generator matrix. Embodiments include any mathematical operation for generating redundant data for an MDS coding technique.

The operations required for the reconstruction of D1 according to embodiments are explained below.

Suppose that D1.1, D1.2 and D1.3 all need to be reconstructed due to the data storage unit that stores D1 being offline. The sub-packet D1.1 is first recovered as:

$$D1.1=R1.1-D2.1-D3.1-D4.1$$

Obtaining the data for performing this operation requires four read operations in order to obtain R1.1, D2.1, D3.1 and D4.1. Each read operation is of a sub-packet that is a third of the size of a data packet.

If D1.2 was similarly reconstructed using R1.2, D2.2, D3.2 and D4.2, then four more read operations would be required. However, embodiments advantageously reconstruct D1.2 using R2.1 rather than R1.2.

$$D1.2=R2.1-D1.1^2-D2.1^2-D2.2-D3.1^2-D4.1^2$$

The only sub-packets that it is necessary to read are R2.1 and D2.2 because all of the other sub-packets were obtained when recovering D1.1. The number of required read operations is therefore only two.

Similarly, D1.3 is obtained from R3.1 as:

$$D1.3=R3.1-D1.1^3-D2.1^3-D2.3-D3.1^3-D4.1^3$$

The only sub-packets that it is necessary to read are R3.1 and D2.3 because all of the other sub-packets were obtained when recovering D1.1.

The total number of read operations in order to recover all of the sub-packets of D1 is therefore eight. The total amount of read data, and therefore network traffic, is two thirds of that necessary if D1 had been recovered according to known RS techniques.

The generator matrix shown in FIG. 1 defines how data is stored across a plurality of separate data storage units. All of D1, D2, D3, D4, R1, R2 and R3 represent the data stored in separate data storage units.

More generally, embodiments encode data for storing in source nodes and redundant nodes of a data storage system. The data storage system of embodiments comprises a data storage network in which source and redundant nodes are configured to communicate data together over a network. Encoding the data stored in each of the nodes according to embodiments, instead of using known RS coding, reduces the required amount of data that needs to be read in order to reconstruct the data in a node that is offline and thereby reduces the amount of data traffic in the data storage system.

A node may comprise any type of data storage unit, such as a disk drive, and also comprises known components for supporting communication with the data storage unit. Each of the nodes comprises a plurality of data storage areas. The data storage areas are partitions of the node. The plurality of the data storage areas store a respective plurality of parts of the coded data in accordance with the generator matrix. For example, the plurality of sub-packets of a data packet shown in FIG. 1 respectively correspond to the plurality of data storage areas of a node. The plurality of storage areas of node may be considered to be blocks, sectors, stripes or sub-stripes of the node.

A preferable technique for generating a generator matrix according to embodiments is described in more detail below.

K=The number of nodes storing source data
R=The number of nodes storing redundant data A systematic set of K+R code words is generated and stored in a respective plurality of K+R nodes.

The process of generating the generator matrix comprises the following steps.

The number of R parity nodes that will be used as redundant nodes for K data nodes is first determined. Any known coding technique is then used to generate a generator matrix for systematically coding source data for storage in K source nodes and R redundant nodes. The applied coding technique preferably has the property of generating a Maximum Distance Separable, MDS, code. A suitable such coding technique is RS but other MDS coding techniques are known and can be applied according to embodiments.

The determination of K and R is, to a certain extent, a matter of design choice. Increasing the number of redundant nodes that are used increases the number of data nodes that can be reconstructed in the event of a plurality of the source nodes being offline. However, increasing the number of data nodes also increases the implementation costs.

In practice, the vast majority of times that a node is offline is due to a managed process such as maintenance and, to ensure that this is not unduly disruptive, only one of the nodes is taken offline at a time. In addition, even if a failure has occurred, it is highly likely that only one of the nodes has failed and multiple node failures simultaneously occurring are very rare. It is therefore preferable that the number of redundant nodes is a lot less than the number of source nodes. This allows for the reconstruction of source nodes in almost all circumstances and does not unnecessarily increase the cost of implementing the system by having redundant nodes that are never likely to be required.

According to embodiments, the number of redundant nodes is preferably less than or equal to half of the number of source nodes. More preferably, the number of redundant nodes is substantially equal to, or less than, a quarter of the number of source nodes.

When the number of redundant and source data nodes has been determined, each node is divided to comprise a plurality of sub-stripes, i.e. data storage areas, for storing coded data. The number of sub-stripes of each node is preferably the same as the number of redundant nodes, i.e. R. Each sub-stripe of a node is preferably of the same size. Accordingly, if a node comprises R sub-stripes, the size of each sub-stripe is preferably 1/R of the size of total used storage capacity for the data of the node. The redundant and source data nodes should all provide a same minimum data storage capacity for data.

Each sub-stripe of the R redundant nodes is referred to as a member of a Sub-Stripe Redundancy Group, SSRG. The first SSRG, $SSRG_1$, comprises the first sub-stripe of each of the R data storage units. Similarly, the $M^{th}$ sub-stripe of each of each redundancy node is respectively assigned to the group $SSRG_M$. The notation $SSRG_{k,M}$ is used to refer to the specific $M^{th}$ sub-stripe in the $k^{th}$ redundant node.

A subset of the K nodes is assigned to each SSRG. The subset of nodes assigned to each SSRG is referred to as a Data Storage Group, DSG. Each of the K source nodes is assigned to a DSG. Preferably, each DSG comprises a plurality of source nodes, all sources nodes are assigned to a DSG and none of the source nodes are assigned to more than one DSG.

The reconstruction of a node is performed using the SSRG associated with the DSG that the node is a member of.

For a given K and R, there is either an integer solution to K/R or this result is a fraction. For an integer solution, the number of nodes in every DSG, i.e. the size of the DSG, is K/R.

If K/R is a fraction, there are two DSG sizes defined as:

$$DSG\_size\_a = \text{ceiling}(K/R) \qquad \text{Eqn. 1}$$

$$DSG\_size\_b = DSG\_size\_a - 1 \qquad \text{Eqn. 2}$$

The number of groups of each DSG size is given by:

$$Count\_DSG\_size\_b = DSG\_size\_a * R - K \qquad \text{Eqn. 3}$$

$$Count\_DSG\_size\_a = R - Count\_DSG\_size\_b \qquad \text{Eqn. 4}$$

The size options for each DSG are then assigned:

$$\text{sizeof}(DSGi) = DSG\_size\_a \text{ for } i \in [1, 2, \ldots, Count\_DSG\_size\_a] \qquad \text{Eqn. 5}$$

$$\text{sizeof}(DSGi) = DSG\_size\_b \text{ for } i \in [Count\_DSG\_size\_a + 1, \ldots, Count\_DSG\_size\_a + Count\_DSG\_size\_b] \qquad \text{Eqn. 6}$$

In accordance with the determined sizes of each DSG group, each data storage unit is assigned to a DSG. For example, if each of the first two DSG groups is of size three, a first three data storage units are assigned to the first DSG and a second three data storage units are assigned to the second DSG.

A process is then performed to modify the data comprised by each redundant node from how it has been generated according to the known coding technique, for example RS.

One of the redundant nodes will be formed as a direct combination of all of the sub-stripes of all of the data storage units. This is referred to as the staging node and comprises staging sub-stripes. The staging sub-stripes are not modified. In FIG. 1, R1 is the staging node.

The data stored in at least one, and preferably all, of the other (R−1) redundant nodes is modified to be further dependent on additional sub-stripes of the source nodes. The number of additional sub-stripes is less than or equal to the number of source nodes in the DSG associated with the SSRG for the sub-stripe. The data used to modify each of the sub-stripes is only taken from the sub-stripes of the source nodes in the DSG corresponding to the SSRG of the sub-stripe. The term $data_{j,k}$ is used to refer to the $k^{th}$ sub-stripe in the $j^{th}$ source node.

The added sub-stripes may be determined according to the following equation:

$$SSRG_{k,i} \mathrel{+}= data_{j,i} \text{ for} \qquad \text{Eqn. 7}$$

$$k \in [2, 3, \ldots, R],$$

$$i \in [1, 2, \ldots, R],$$

$$j \in DSGi(i.e.\ \text{one or more of the source nodes in } DSGi),$$

$$l = \begin{cases} k, & \text{if } i < k \\ k - 1, & \text{otherwise} \end{cases}$$

Equation 7 defines which locations within the generator matrix can be modified. It is not necessary for all of the locations within the generator matrix determined by Equation 7 to be modified and embodiments include only a subset of these locations being used. Equation 7 can also be used to determine the values added to the generator matrix to modify it. The values can be added by any known combination operation, such as an XOR operation.

The generator matrix therefore defines how to generate the redundant nodes in dependence on a combination of sub-stripes of the source nodes. The combination of sub-stripes may be by, for example, finite field operations such as Galois Field addition or multiplication. It is particularly preferable for data to be combined by XOR addition as it is known that this operation can be performed very efficiently in finite fields.

To recover a single source node j, the SSRG that is associated with the DSG that contains the source node j is first determined.

The staging sub-stripe of the SSRG is used to recover a single sub-stripe of source node j. The staging stripe is unmodified and so the data traffic is the same as that required by the original underlying encoding. Accordingly, K sub-stripes of size 1/R of the size of a node are read. The read data is stored in memory. The other (R−1) sub-stripes in the SSRG are then used to recover each of the other sub-stripes of source node j. For each of the other sub-stripes, it is only necessary to read (DSGi−1) other sub-stripes of source nodes and one sub-stripe of a redundant node.

The total number of sub-stripes read to reconstruct the source node j in DSGi is therefore:

$$Reads\_Recover\_j = K + sizeof(DSGi)*(R-1) \qquad \text{Eqn. 9}$$

In total, the original underlying encoding requires reading K*R sub-stripes. Embodiments therefore result in a significant reduction in the amount of read data.

When K=R, embodiments provide optimum recovery of a source node for an MDS code in that it minimises the amount of required data traffic. In the preferable circumstance of K>R, embodiments either provide optimum, or close to optimum, recovery of a source node.

The processes of embodiments are explained with reference to the following exemplary implementation of an embodiment.

FIG. 2, shows the part of the generator matrix that defines how to generate redundant nodes for a systematically generated set of coded data packets with K=10 and R=4. There are ten data drives that are each source nodes as described above. The four parity drives are each redundant nodes as described above.

Each of the data drives is dived into four sub-stripes, referred to as A, B, C and D. Data drive 1 stores a concatenation of sub-stripes A1, B1, C1 and D1. Similarly, data drive n stores a concatenation of sub-stripes An, Bn, Cn and Dn.

For each sub-stripe of each parity drive, the non-zero position of each value in the row for the sub-stripe defines which sub-stripes of the data drives are combined to generate the sub-stripe of the parity drive. The actual values define how the sub-stripes are combined.

Accordingly, the first sub-stripe of the first parity drive is defined as:

$$P1.1 = A1 + A2 + A3 + A4 + A5 + A6 + A7 + A8 + A9 + A10$$

All of the sub-stripes of parity drive 1 together store a combination of all of the sub-stripes in all of the data drives.

For the other parity drives, the actual values would all be different due to the underlying MDS coding scheme.

FIG. 3 shows the SSRG groups for each of the sub-stripes of each of the parity drives.

Equations 1 and 2 are used to determine the size of each DSG group:

$$DSG\_size\_a = ceil(10/4) = 3$$

$$DSG\_size\_b = DSG\_size\_a - 1 = 3 - 1 = 2$$

Equations 3 and 4 are used to determine the number of DSG groups of each size:

$$Count\_DSG\_size\_b = DSG\_size\_a*4 - 10 = 3*4 - 10 = 2$$

$$Count\_DSG\_size\_a = 4 - Count\_DSG\_size\_b = 4 - 2 = 2$$

Equations 5 and 6 are used to assign each DSG a size:

$$sizeof(DSG\_1) = 3$$

$$sizeof(DSG\_2) = 3$$

$$sizeof(DSG\_3) = 2$$

$$sizeof(DSG\_4) = 2$$

Each of the K=10 data drives are assigned to a DSG:

$$DSG\_1 = [1,2,3]$$

$$DSG\_2 = [4,5,6]$$

$$DSG\_3 = [7,8]$$

$$DSG\_4 = [9,10]$$

Each DSG is associated with a SSRG.

Equation 7 is then used to construct the generator matrix. SSRG_1_1, SSRG_1_2, SSRG_1_3 and SSRG_1_4 are not modified. The other SSRGs are modified to be further dependent on additional sub-stripes of the source data as shown below:

SSRG_2_1+=data_1_2+data_2_2+data_3_2 (i.e. B1+B2+B3)

SSRG_3_1+=data_1_3+data_2_3+data_3_3 (i.e. C1+C2+C3)

SSRG_4_1+=data_1_4+data_2_4+data_3_4 (i.e. D1+D2+D3)

SSRG_2_2+=data_4_2+data_5_2+data_6-2 (i.e. B4+B5+B6)

SSRG_3_2+=data_4_3+data_5_3+data_6_3 (i.e. C4+C5+C6)

SSRG_4_2+=data_4_4+data_5_4+data_6_4 (i.e. D4+D5+D6)

SSRG_2_3+=data_7_2+data_8_2 (i.e. B7+B8)

SSRG_3_3+=data_7_3+data_8_3 (i.e. C7+C8)

SSRG_4_3+=data_7_4+data_8_4 (i.e. D7+D8)

SSRG_2_4+=data_9_2+data_10_2 (i.e. B9+B10)

SSRG_3_4+=data_9_3+data_103 (i.e. C9+C10)

SSRG_4_4+=data_9_4+data_10_4 (i.e. D9+D10)

Figure 4:
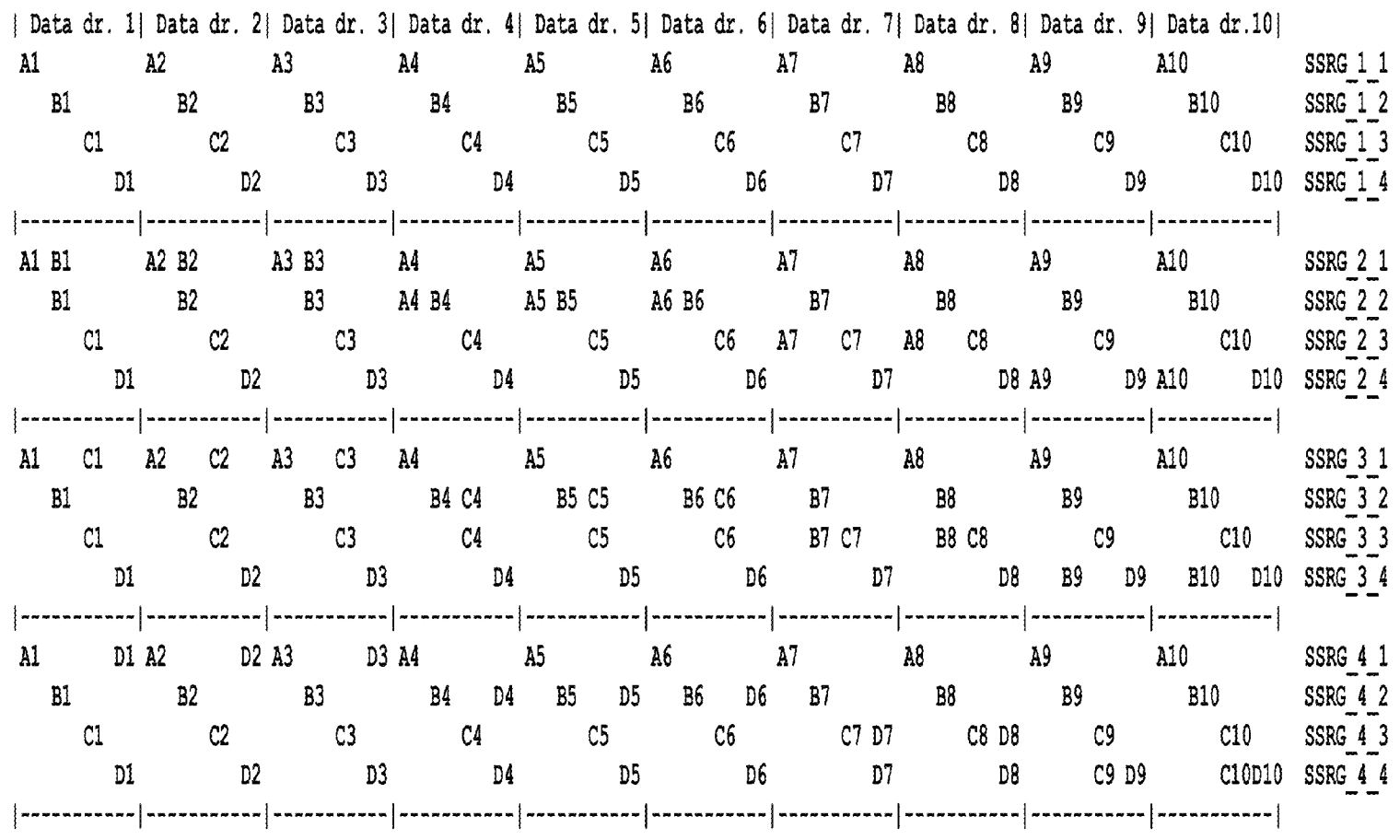

The modified generator matrix is shown in FIG. 4.

FIG. 5 shows an example of a generator matrix that has been generated according to an embodiment. The code is (14,10), i.e. K=10 and R=4.

FIG. 6 shows exemplary actual values of the part of a (14,10) generator matrix, that has been generated according to an embodiment, that defines how redundant data nodes are generated when the number of sub-stripes of each node is equal to the number of redundant nodes. The code has been constructed over GF(16). It is a systematic generator matrix and so the part of the generator matrix that defines the source data nodes would be the identity matrix.

The relationship between source data and the data nodes may be represented as:

$A1 \leftrightarrow x[1]$ $B1 \leftrightarrow x[2]$ $C1 \leftrightarrow x[3]$ $D1 \leftrightarrow x[4]$ $A2 \leftrightarrow x[5]$ $B2 \leftrightarrow x[5]$, etc.

The relationship between source data and the data nodes may be represented as:

$SSRG\_1\_1 \leftrightarrow y[1]$ $SSRG\_1\_2 \leftrightarrow y[2]$ $SSRG\_1\_3 \leftrightarrow y[3]$ $SSRG\_1\_4 \leftrightarrow y[4]$ $SSRG\_2\_1 \leftrightarrow y[5]$ $SSRG\_2\_2 \leftrightarrow y[6]$, etc.

The values in the generator matrix for each sub-stripe of the redundant nodes can be defined by finite field multiplication and addition operations.

For example, using the values in FIG. 6:

$y[1]=x[1].fld[1]+x[5].fld[8]+x[9].fld[9]+x[13].fld[15]+x[17].fld[5]+x[21].fld[15]+x[25].fld[12]+x[29].fld[14]+x[33].fld[10]+x[37].fld[12]$ Where x[m].fld[n] is x[m] multiplied by n in GF(16).

Suppose that it is necessary to recover data drive 1 due to this data drive being offline. A normal RS recovery is performed on SSRG_1_1 to recover all of A1 (=data_1_1) with 10 read operation of size ¼ of data drive 1.

$A1=SSRG\_1\_1-(A2+A3+A4+A5+A6+A7+A8+A9+A10)$

All of the read sub-stripes A2, A3, A4, A5, A6, A7, A8, A9 and A10 are retained in memory.

To recover B1, it is only necessary to read B2, B3 and SSRG 2_1.

To recover C1, it is only necessary to read C2, C3 and SSRG 3_1.

To recover D1, it is only necessary to read D2, D3 and SSRG 4_1.

The total number of read operations is therefore 10+3+3+3=19, with each read being of ¼ of the size of a data drive. Processing is required on the read data to reconstruct the source data. However, the time required to read data is typically a lot longer than the processing time and so, to reduce the time required to reconstruct source data, it is more important to reduce the amount of read, i.e. transferred, data.

RS would require 10 reads of the full size of a data drive. The amount of read data would therefore be 40 of ¼ of the size of a data drive.

The above described implementation of an embodiment therefore results in a significant reduction in the amount of data that is read, or transferred, in order to reconstruct a source node. The amount of improvement provided by codes generated according to embodiments over known RS coding techniques will depend of the properties of the specific code. However, the amount of read, or transferred, data will typically be 50% to 60% less than that required by RS.

This is a greater reduction of read data than achievable with other known techniques.

As an example, demonstrated below are the advantages over the technique disclosed in FIG. 4 of the paper 'A "Hitchhiker's" Guide to Fast and Efficient Data Reconstruction in Erasure-coded Data Centres' by K. V. Rashimi et al, SIGCOMM 2014, Computer Communication Review, August 2014, as discussed in the background section of the present document and referred to herein as 'Hitchhiker'.

FIG. 7 shows the modified generator matrix according to Hitchhiker.

Recovering B1 of data drive 1 requires reading 10 sub-stripes of size ½ a data drive, i.e. the redundancy F_1_B and the 9 sub-stripes B2 to B10. To recover A1, it is necessary to read F_2_B as well as A2 and A3, i.e. three reads of ½ a data drive. The total number of read operations is 13 with each read being of ½ a data drive. The total amount of read data by RS would be 20 reads of ½ a data drive.

Accordingly, Hitchhiker reduces the amount of read data from that of RS by 35% whereas embodiments provide the greater reduction of 52.5%.

This improvement arises from the completely different approach to generating a generator matrix from that taught in Hitchhiker. Hitchhiker is an improvement on a known technique, referred to therein as 'piggybacking', in which two separate RS coded data packets are effectively combined within restraints resulting from the piggybacking technique. The approach according to embodiments is to generate a generator matrix for systematically coding source data, as if a single set of coded data was being generated, and then modify this generator matrix internally. Each source and data node is then sub-divided into a plurality of sub-stripes and the redundant sub-stripes modified. The number of sub-stripes that each node is divided into is preferably the same as the number of redundant nodes. Accordingly, embodiments typically will divide a node into three or more sub-stripes.

Figure 8A:
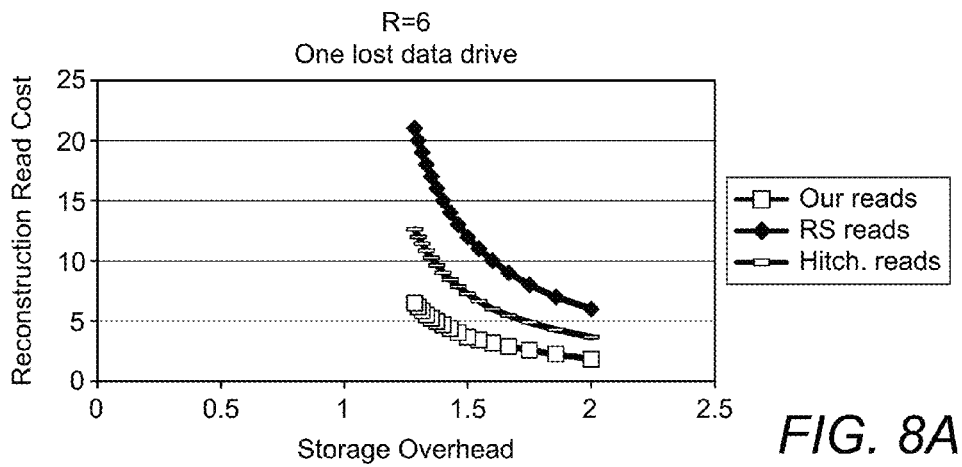
FIGS. 8A to 8F are results that demonstrate advantages of embodiments of the invention.
Figure 8B:
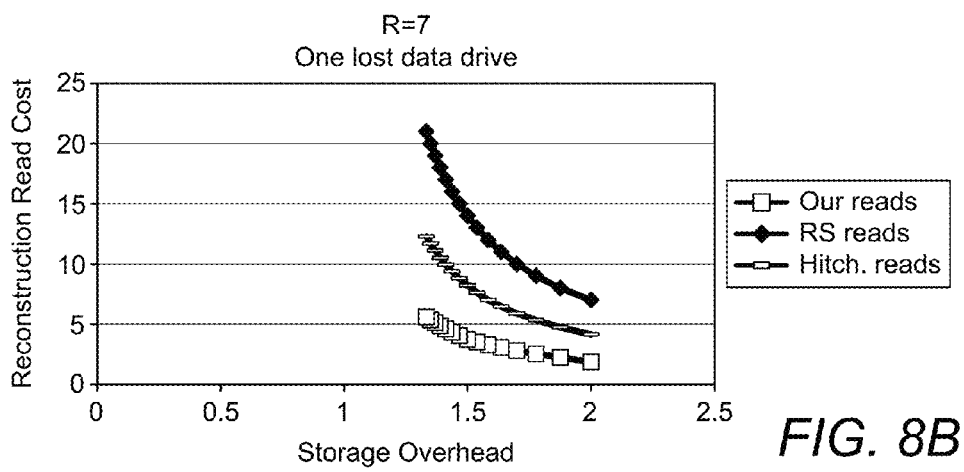
Figure 8C:
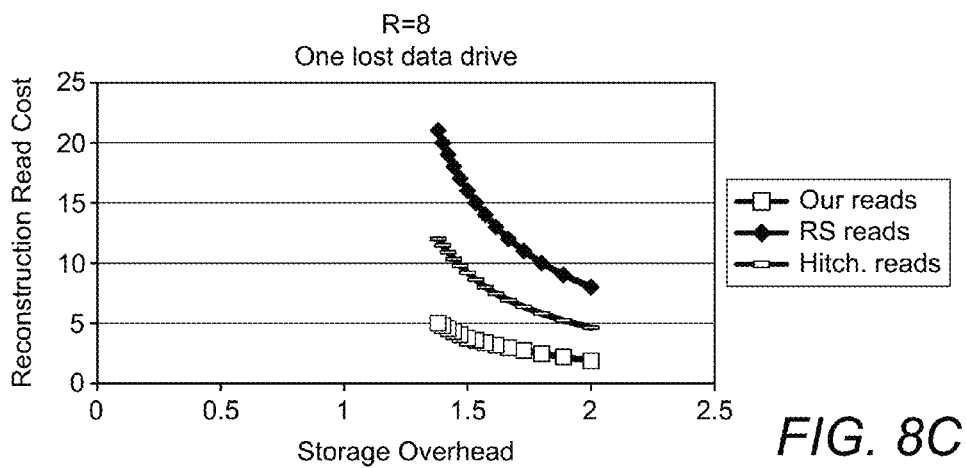
Figure 8D:
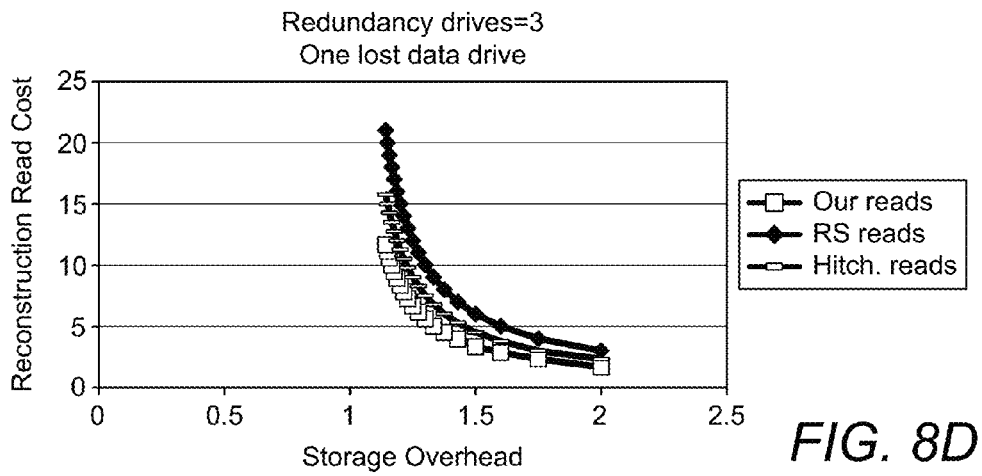
Figure 8E:
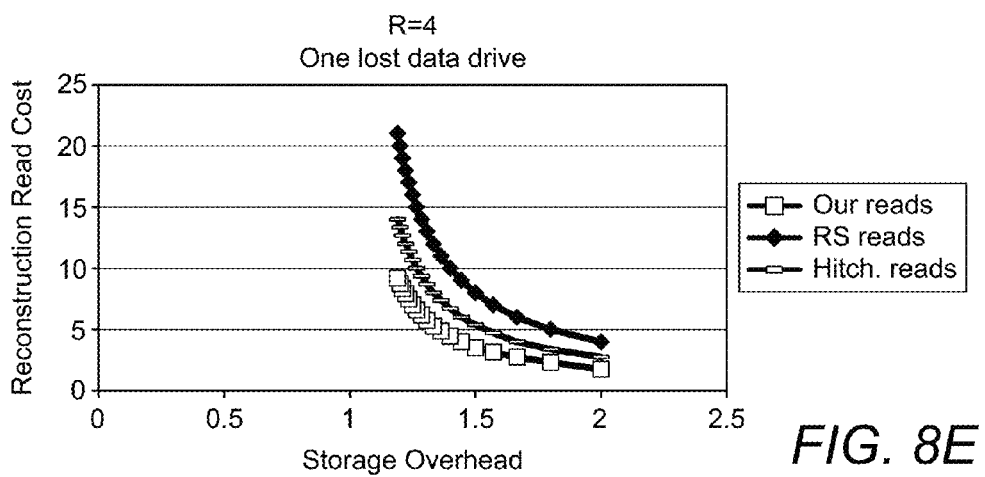
Figure 8F:
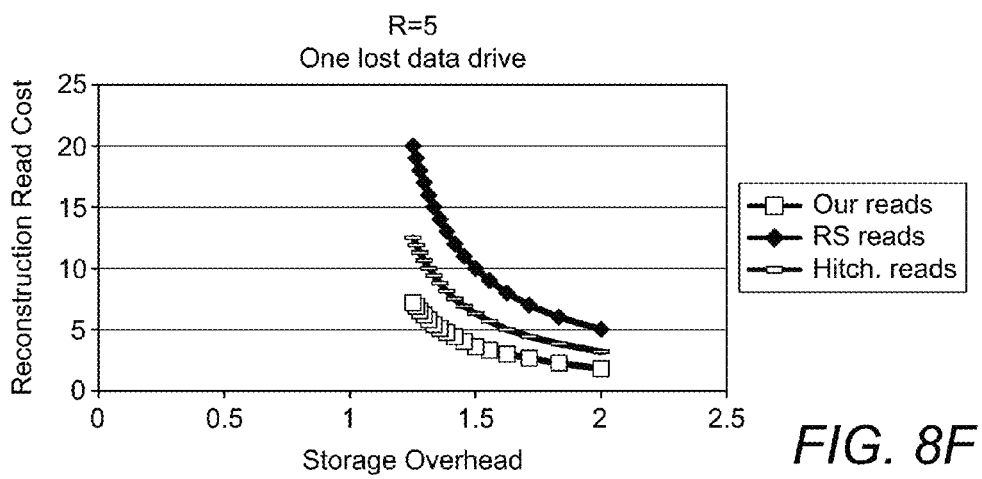

FIGS. 8A to 8F respectively show the reconstruction read cost for R=3 to 7 for a RS code, the HitchHiker code and the code according to embodiments. Using the notation C(K+R,R), FIG. 8A shows the performance of the codes when R=3 and K=3 to 21; FIG. 8B shows the performance of the codes when R=4 and K=4 to 21; FIG. 8C shows the performance of the codes when R=5 and K=5 to 20; FIG. 8D shows the performance of the codes when R=6 and K=6 to 21; FIG. 8E shows the performance of the codes when R=7 and K=7 to 21; and FIG. 8F shows the performance of the codes when R=8 and K=8 to 21. The storage overhead is calculated as (K+R)/K. For all of the values of R, the reconstruction read cost is lowest when the code according to embodiments is used.

In the above-described embodiments, each redundant node is a combination of sub-stripes of source nodes. The sub-stripes may be combined using either addition or multiplication operations as known in finite field mathematics. The added values to the generator matrix as a result of modifying the generator matrix according to embodiments is preferably the value '1' and the combination of the sub-stripes is preferably by addition operations. Generating a sub-stripe of a redundant node in further dependence on each of the additional sub-stripes would then only require XOR addition operations and these can be performed very efficiently.

Preferably, each generator matrix that has been generated according to embodiments is tested to determine that it still maintains MDS properties. This preferably is part of an iterative process with each iteration either changing a value of one of the new values introduced into the generator matrix due to modifying the generator matrix according to embodiments, or the location of one of the additional values introduced into the generator matrix could be changed. The iterative process would be stopped as soon as the generator matrix was determined to be MDS. Advantageously, the obtained generator matrixes according to this embodiment are always MDS.

An advantageous property of the generator matrix according to embodiments is that if all of the columns of the generator matrix are linearly independent, the generator matrix defines an MDS coding technique.

Suppose that the first sub-stripe of each of the source and data nodes defined by the generator matrix are used to define the elements of the code $C_1(K+R,R)$. Similarly, the $i^{th}$ sub-stripe of each of the source and data nodes are used to define the elements of the code $C_1(K+R,R)$ so that R codes are defined. If the codes $C_1(K+R,R), \ldots, C_R(K+R,R)$, are linearly independent, then the generator matrix retains its MDS property for up to R full disk losses. The modification of the code to include the additional data defined by $data_{j,k}$, according to Equation 7 described above, in $C_i(K+R,R)$ does not destroy the MDS property of the code so long as the additional data is not part of the MDS code $C_i(K+R,R)$ and $C_i(K+R,R)$ is linearly independent to the (R−1) other codes. The additional data is effectively a constant and the R linearly independent codes can be concatenated to from an MDS code.

Accordingly, a preferably way of determining if a generator matrix that has been generated according to the techniques of embodiments is MDS is to from the R codes $C_1(K+R,R), \ldots, C_R(K+R,R)$ as described above and then to determine if the codes are all linearly independent to each other. If the codes are all linearly independent to each other, then the generator matrix is MDS.

The above technique for determining if a generator matrix is MDS can also be applied to generator matrices that have been generated according to other techniques than the above embodiments and have values that define operations either at the node or at the sub-stripe level. If each of the R codes defined by the generator matrix is determined to be MDS, then the generator matrix is MDS.

TABLE 1

| Code (K + R, K) | K  | R |
|-----------------|----|---|
| (23, 20)        | 20 | 3 |
| (27, 24)        | 24 | 3 |
| (28, 25)        | 25 | 3 |
| (14, 20)        | 10 | 4 |
| (16, 12)        | 12 | 4 |
| (17, 13)        | 13 | 4 |
| (18, 14)        | 14 | 4 |
| (20, 16)        | 16 | 4 |
| (15, 10)        | 10 | 5 |
| (12, 6)         | 6  | 6 |

Example values for K and R for implementation in embodiments are shown in the above Table 1. The codes shown in Table 1 cover many common disk array sizes. As explained above, particularly preferable are codes with K a lot greater than R. These are the most efficient as only one source node reconstruction at a particular time is likely to be required. The codes in Table 1 have all been implemented and tested according to the methods of embodiments. The underlying code was RS GF(256). The additional sub-stripes that each redundant node was dependent on were combined by XOR operations as described above. All of the codes maintained their MDS property as well as providing the advantage of embodiments, in particular a low number of data reads being required and easy generation of the generator matrix.

Embodiments also include using more complex GF(256) operations and this would allow larger configurations to be realised.

Embodiments provide both an advantageous generator matrix and an advantageous method for generating the generator matrix.

Embodiments improve on all known MDS coding techniques that have the advantageous properties of being systematic and not requiring a higher data storage capacity as standard Reed-Solomon. The improvement over a known coding technique may include one or more of a reduction in the amount of data that is read/transferred in order to reconstruct a node, the properties of the code that can be used (including the relative number of source and redundant data packets), the amount of processing required to generate the coded data and the amount of processing required to reconstruct source data from the coded data. Embodiments are particularly advantageous when more than two substripes are used. The reduction in the amount of data that is read/transferred in order to reconstruct a node can be increased by increasing the number of redundant nodes and sub-stripes. The code according to embodiments is minimum-storage-regenerating, MSR, since the total amount of data transferred during reconstruction is lower than in RS codes. MSR codes were originally formulated in 'Network coding for distributed storage systems', Dimakis et al, IEEE Transactions on Information Theory 56, 9 (September 2010), 4539-4551.

Embodiments are particularly appropriate for generating data for storage in nodes of a data storage system. In a typical implementation of such a system the number of redundant data nodes is a lot fewer than the number of source data nodes. The total number of redundant data nodes is preferably more than 2 but it is not normal for the number of redundant data nodes to be more than 6. Embodiments are particularly advantageous when the number of sub-stripes is the same as the number of redundant data nodes. Accordingly, in an advantageous implementation of an embodiment in a data storage system, the number of sub-stripes in each node is more than 2 but not more than 6.

The actual generation of coded data in dependence on source data and a generator matrix according to an embodiment can be performed with known techniques and using known hardware. The processes required to use the techniques according to embodiments to generate a plurality of source nodes and redundant nodes in a data storage system/network of a data centre storing the coded data would be a straightforward task for the skilled person. The skilled person would also be able to use known hardware to reconstruct one or more source nodes in order to implement embodiments.

The method according to embodiments may be performed within a single SSD disk. The method according to embodiments may be performed between chips inside a SSD, or between banks inside (flash) chips.

Figure 9:
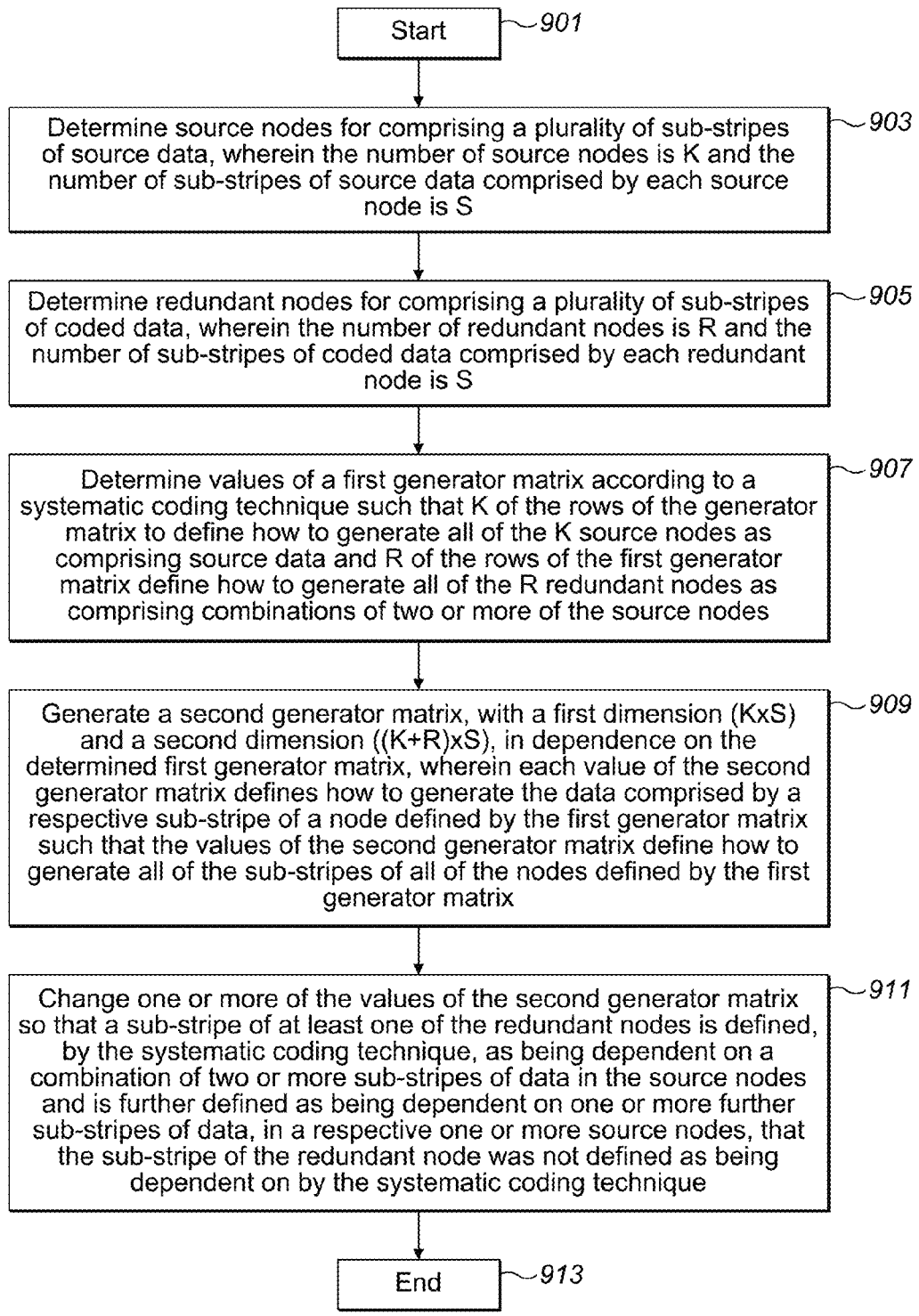
FIG. 9 is a flowchart according to an embodiment of the invention.

FIG. 9 is a flowchart of a method according to an embodiment.

In step 901, the process begins.

In step 903, the method determines source nodes for comprising a plurality of sub-stripes of source data, wherein the number of source nodes is K and the number of sub-stripes of source data comprised by each source node is S.

In step 905, the method determines redundant nodes for comprising a plurality of sub-stripes of coded data, wherein the number of redundant nodes is R and the number of sub-stripes of coded data comprised by each redundant node is S.

In step 907, the method determines values of a first generator matrix according to a systematic coding technique such that K of the rows of the generator matrix to define how to generate all of the K source nodes as comprising source data and R of the rows of the first generator matrix define how to generate all of the R redundant nodes as comprising combinations of two or more of the source nodes.

In step 909, the method generates a second generator matrix, with a first dimension (K×S) and a second dimension ((K+R)×S), in dependence on the determined first generator matrix, wherein each value of the second generator matrix defines how to generate the data comprised by a respective sub-stripe of a node defined by the first generator matrix such that the values of the second generator matrix define how to generate all of the sub-stripes of all of the nodes defined by the first generator matrix.

In step 911, the method changes one or more of the values of the second generator matrix so that a sub-stripe of at least one of the redundant nodes is defined, by the systematic coding technique, as being dependent on a combination of two or more sub-stripes of data in the source nodes and is further defined as being dependent on one or more further sub-stripes of data, in a respective one or more source nodes, that the sub-stripe of the redundant node was not defined as being dependent on by the systematic coding technique.

In step 913, the method ends.

Figure 10:
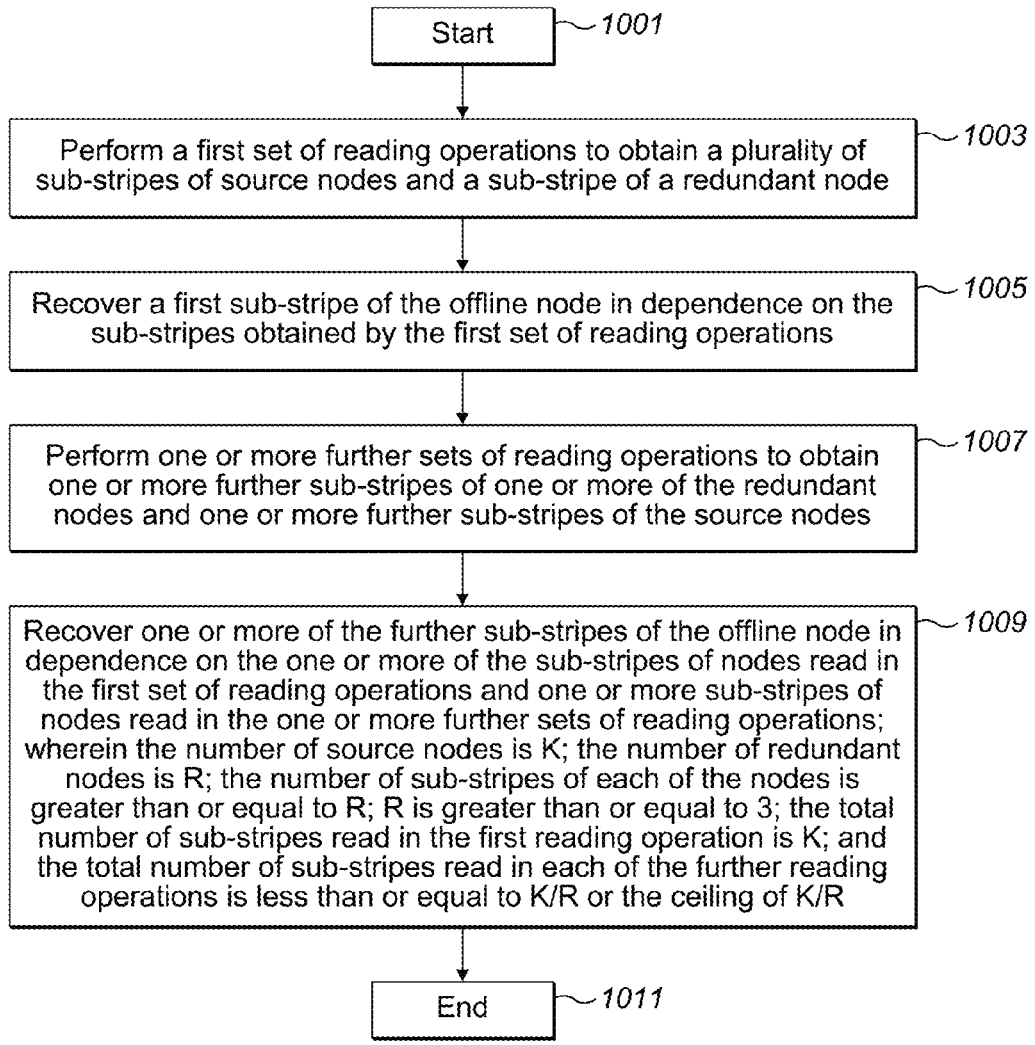
FIG. 10 is a flowchart according to an embodiment of the invention.

FIG. 10 is a flowchart of a method according to an embodiment.

In step 1001, the process begins.

In step 1003, the method performs a first set of reading operations to obtain a plurality of sub-stripes of source nodes and a sub-stripe of a redundant node In step 1005, the method recovers a first sub-stripe of the offline node in dependence on the sub-stripes obtained by the first set of reading operations In step 1007, the method performs one or more further sets of reading operations to obtain one or more further sub-stripes of one or more of the redundant nodes and one or more further sub-stripes of the source nodes In step 1009, the method recovers one or more of the further sub-stripes of the offline node in dependence on the one or more of the sub-stripes of nodes read in the first set of reading operations and one or more sub-stripes of nodes read in the one or more further sets of reading operations; wherein the number of source nodes is K; the number of redundant nodes is R; the number of sub-stripes of each of the nodes is greater than or equal to R; R is greater than or equal to 3; the total number of sub-stripes read in the first reading operation is K; and the total number of sub-stripes read in each of the further reading operations is less than or equal to K/R or the ceiling of K/R In step 1011, the method ends.

Throughout the present document, the techniques according to embodiments have been presented and explained as modifications to a generator matrix. However, as explained earlier, a generator matrix is only a convenient way of representing what, and how, data is combined in order to generate coded data and other representations exist. Accordingly, embodiments provide an advantageous technique for coding and decoding data. The coding and decoding of data according to embodiments is therefore by any technique that can be represented by operations on a generator matrix as described throughout the present document.

Embodiments of the invention also include a number of further modifications and variations to the embodiments as described above.

As described above, any of a number of coding techniques can be used to originally code a generator matrix for modification according to embodiments. It is preferable that the modified generator matrix is MDS and, although it is preferable that the coding technique is MDS in order to increase the likelihood of the modified generator matrix being MDS, it is not essential for the coding technique to be MDS. By not using an MDS coding technique, the generator matrix according to the embodiments may still be MDS and the efficiency of coding and/or decoding source data may be improved.

In the above-described embodiments, the size of each sub-stripe is 1/R of the size of a node. A preferable alternative is for the size of each sub-stripe to be chosen so that it is appropriate given the underlying hardware of the node. If the size of such a sub-stripe is Block_size, then each node would be divided into one or more sectors with each sector having size Block_size*R. Any of the nodes may have only one sector and there may also be unused data storage capacity on the node. For nodes that have more than one sector, each sector is treated as a separate and independent node in the data storage system with a single data storage unit providing the data storage capacity of a plurality of nodes. Preferably, the nodes in each DSG are chosen such that each of the nodes in each DSG is stored by a different data storage unit. That is to say, when a single data storage unit provides the data storage capacity of a plurality of nodes, each of the nodes is comprised by a different DSG. Preferably, if the DSGs have the different sizes DSG_size_a and DSG_size_b, each data storage unit has approximately the same number of DSG groups of each size. This improves the ease of system recovery in the event of a failure of a data storage unit.

Each node is preferably divided into 1/R sub-stripes. However, embodiments also include dividing each node into a larger number of sub-stripes.

It is normally preferable for a generator matrix to, as far as possible, generate redundant nodes that require substantially the same amount of processing to reconstruct any one of the source nodes. However, in certain applications, it may be preferable for some of the source nodes to be quicker to reconstruct than others. Embodiments also include the generation of such generator matrices by only modifying the redundant nodes to be dependent on sub-stripes of specific source nodes. An example of this is shown in FIG. 1 in which D1 and D2 can be reconstructed faster than D3 and D4. By not modifying redundant nodes to aid the reconstruction of D3 and D4, the number of read operations required to generate D1 and D2 is reduced and these can be reconstructed faster.

Preferably, the data defined in neighbouring cells in a row of the generator matrix is stored in neighbouring sub-stripes of a data storage unit. This can increase the efficiency of reading the data. In particular, a staging stripe may be read by performing a single read of a plurality of contiguous sub-stripes.

The codes according to embodiments can be constructed over any GF field of size GF(2$^n$) so long as n is large enough for a MDS erasure code to be generated. A typical implementation would have a GF field size of GF(16) or GF(256).

In embodiments it is preferable that the DSG group sizes are defined by Equations 1 and 2 above. However, embodiments also include the DSG group sizes being alternatively determined. For example, the DSG group sizes may be selected so that certain nodes have their reconstruction cost reduced over other nodes. It is not necessary for the DSG groups to include all of the nodes and some of the nodes may not be present in a DSG.

The coding techniques of embodiments can also be used in other applications in which redundant data nodes or packets are generated, including network coding and data transmission in general.

The flow charts and descriptions thereof herein should not be understood to prescribe a fixed order of performing the method steps described therein. Rather, the method steps may be performed in any order that is practicable. Although the present invention has been described in connection with specific exemplary embodiments, it should be understood that various changes, substitutions, and alterations apparent to those skilled in the art can be made to the disclosed embodiments without departing from the spirit and scope of the invention as set forth in the appended claims.

Methods and processes described herein can be embodied as code (e.g., software code) and/or data. Such code and data can be stored on one or more computer-readable media, which may include any device or medium that can store code and/or data for use by a computer system. When a computer system reads and executes the code and/or data stored on a computer-readable medium, the computer system performs the methods and processes embodied as data structures and code stored within the computer-readable storage medium. In certain embodiments, one or more of the steps of the methods and processes described herein can be performed by a processor (e.g., a processor of a computer system or data storage system).

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that is capable of storing computer-readable information/data. Computer-readable media should not be construed or interpreted to include any propagating signals.

The invention claimed is:

1. A method of generating systematically encoded data from source data, the method comprising:

determining source nodes for comprising a plurality of sub-stripes of source data, wherein the number of source nodes is K and the number of sub-stripes of source data comprised by each source node is S;

determining redundant nodes for comprising a plurality of sub-stripes of coded data, wherein the number of redundant nodes is R and the number of sub-stripes of coded data comprised by each redundant node is also S, such that each redundant node is determined to have the same number of sub-stripes as each source node, wherein S is greater than or equal to R;

determining values of a first generator matrix according to a systematic coding technique, the first generator matrix having a first dimension of (K+R) and a second dimension of K, wherein either the first dimension is the number of rows of the first generator matrix and the second dimension is the number of columns of the first generator matrix or the first dimension is the number of columns of the first generator matrix and the second dimension is the number of rows of the first generator matrix, and the first generator matrix is determined such that any K of the rows, or any K of the columns, of the first generator matrix define how to generate all of the K source nodes as comprising source data and R of the rows, or R of the columns, of the first generator matrix define how to generate all of the R redundant nodes as comprising combinations of source data comprised in two or more of the source nodes;

generating a second generator matrix, with a first dimension (K×S) and a second dimension ((K+R)×S), wherein either the first dimension is the number of rows of the second generator matrix and the second dimension is the number of columns of the second generator matrix or the first dimension is the number of columns of the second generator matrix and the second dimension is the number of rows of the second generator matrix, the first and second dimensions of the second generator matrix being generated in dependence on the determined first generator matrix, wherein each value of the second generator matrix defines how to generate the data comprised by a respective sub-stripe of a node defined by the first generator matrix such that the values of the second generator matrix define how to generate all of the sub-stripes of all of the nodes defined by the first generator matrix;

determining not to change the values in the second generator matrix that define, in accordance with the systemic coding technique, the sub-stripes of the source nodes used to generate the sub-stripes of one of the redundant nodes, wherein said one of the redundant nodes is defined by the first generator matrix as a combination of all the source nodes;

changing one or more of the values of the second generator matrix so that a sub-stripe of at least one of the redundant nodes is defined, by the systematic coding technique, as being dependent on a combination of two or more sub-stripes of data in the source nodes and is further defined as being dependent on one or more further sub-stripes of data, in a respective one or more source nodes, that the sub-stripe of the redundant node was not defined as being dependent on by the systematic coding technique;

encoding source data in dependence on said second generator matrix with one or more changed values; and storing the encoded data in a data storage system;

wherein R is less than or equal to K, and R is 3 or more.

2. The method according to claim 1, wherein determining the values in the second generator matrix that are changed comprises:

determining to group the sub-stripes of the defined redundant nodes by the second generator matrix into groups, SSRGs, such that each sub-stripe of each redundant node is a member of an SSRG, each sub-stripe within a redundant node is a member of a different SSRG and the number of SSRGs is S;

determining to group the defined source nodes by the second generator matrix into node groups, DSGs, wherein each source node is associated with a DSG and the number of DSGs is S;

associating each DSG with one of the SSRGs; and determining to change the values of a sub-stripe in the second generator matrix in dependence on the DSG associated with the SSRG that the sub-stripe is a member of.

3. The method according to claim 2, wherein:

the number of nodes in each DSG is K/R, when K/R is an integer; and the number of nodes in each DSG is either ceiling(K/R) or (ceiling(K/R)−1), when K/R is not an integer.

4. The method according to claim 2, wherein each SSRG comprises only one sub-stripe from each of all of the redundant nodes.

5. The method according to claim 2, wherein the changed values in the second generator matrix are determined for the $i^{th}$ sub-stripe of the $k^{th}$ redundant node in dependence on the equation:

$$SSRG_{k,i} \mathrel{+}= data_{j,1} \text{ for}$$
$$k \in [2, 3, \ldots, R],$$
$$i \in [1, 2, \ldots, S],$$
$$j \in DSGi,$$
$$1 = \begin{cases} k, & \text{if } i < k \\ k-1, & \text{otherwise} \end{cases}$$

where $data_{j,l}$ is the $l^{th}$ sub-stripe in the $j^{th}$ source node.

6. The method according to claim 1, further comprising:

determining if the second generator matrix defines an MDS code;

and, if the second generator matrix does not define an MDS code, repeatedly changing one or more values of the second generator matrix and determining if the second generator matrix defines an MDS code until the second generator matrix defines an MDS code.

7. The method according to claim 1, wherein determining if the second generator matrix defines an MDS code comprises:

generating S codes, wherein each code has a first the dimension comprising one element and a second dimension comprising ((K+R)×S) elements, and the S codes concatenate to form all of the elements of the second generator matrix; and determining that the second generator matrix defines an MDS code if all of the S codes are linearly independent to each other.

8. The method according to claim 1, wherein R is less than or equal to K/4.

9. The method according to claim 1, wherein the coding technique used to generate the first generator matrix is a coding technique for generating an MDS code.

10. The method according to claim 1, wherein the source and redundant nodes defined by the second generator matrix are storage nodes in a data storage system.

11. A method of generating coded data from source data, the method comprising coding data according to a coding technique, wherein coded data generated according to said coding technique is the same as coded data generated in dependence on the second generator matrix according to claim 1.

12. A method of decoding systematically encoded data that is stored in a data storage system, the method comprising decoding encoded data in dependence on the inverse of the second generator matrix according to claim 1.

* * * * *